United States Patent
Huang

(10) Patent No.: US 6,187,480 B1
(45) Date of Patent: Feb. 13, 2001

(54) ALTERNATING PHASE-SHIFTING MASK

(75) Inventor: Chien-Chao Huang, Kaohsiung (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/094,460

(22) Filed: Jun. 10, 1998

(30) Foreign Application Priority Data

Apr. 3, 1998 (TW) .................................................. 87105067

(51) Int. Cl.$^7$ ....................................................... G03F 9/00
(52) U.S. Cl. .............................................................. 430/5
(58) Field of Search ................................ 430/5, 322, 323, 430/324

(56) References Cited

U.S. PATENT DOCUMENTS

| | | | |
|---|---|---|---|
| 5,275,896 | * | 1/1994 | Garofalo et al. ........................... 430/5 |
| 5,358,808 | * | 10/1994 | Nitayama et al. ......................... 430/5 |
| 5,380,608 | * | 1/1995 | Miyashita et al. ......................... 430/5 |
| 5,478,678 | * | 12/1995 | Yang et al. ................................ 430/5 |
| 5,549,995 | * | 8/1996 | Tanaka et al. ............................. 430/5 |
| 5,605,776 | * | 2/1997 | Isao et al. .................................. 430/5 |

* cited by examiner

Primary Examiner—S. Rosasco

(57) ABSTRACT

A alternating phase shift mask comprises a phase shift layer formed between a light-penetrable substrate and a sheltering layer. The sheltering layer covers a sheltered region formed on the phase shift layer. The section of the light-penetrable substrate exposed by the phase shift layer and the sheltering layer is defined as a penetrating region. Incident light forms a phase angle of 180° in the penetrating region and the sheltering layer to make constructive interference and to enhance the resolution of photolithographic process.

5 Claims, 2 Drawing Sheets

ALTERNATING PHASE-SHIFTING MASK

CROSS-REFERENCE TO RELATED APPLICATION

This application claims the priority benefit of Taiwan application serial no. 87105067, filed Apr. 3, 1998, the full disclosure of which is incorporated herein by reference.

BACKGROUND OF THE INVENTION

1. Field of the Invention

The invention relates in general to a photolithography process, and more particularly to a phase-shifting mask and the manufacturing method thereof.

2. Description of the Related Art

In semiconductor fabrication, photolithography is an important and indispensable technique that is used to transfer circuit layout patterns through a mask onto predefined locations on a semiconductor wafer. Many processes in semiconductor fabrications, such as etching and ion implantation, require the use of photolithography. In a photolithographic process, resolution and depth of focus (DOF) are two major checkpoints used to appraise the quality of the pattern definition. A high level of integration requires a high resolution of pattern definition since the feature size is very small. To increase the resolution, a laser source with a very short wavelength, such as a krypton (Kr) deep ultraviolet laser with a wavelength of 2480 Å (angstrom), is used as the exposure light in the photolithographic process. The use of a short-wavelength exposure light, however, will result in a shallow DOF. To allow high resolution and good DOF, one solution is to use the so-called phase-shifting mask (PSM).

Fundamentally, a PSM is formed by adding phase shifter layers to a conventional mask, which phase shifter layers cause destructive interference to the light passing through it such that the contrast and resolution of the resulting pattern definition can be increased. One benefit of the PSM is that it can increase the resolution of pattern definition without having to change the wavelength of the exposure light.

In semiconductor fabrication, line patterns are usually required to form structures such as metal interconnections, bit lines and word lines of dynamic random access memories (DRAM). Conventionally, a post-photoresist is used to execute a photolithography process. In highly integrated of devices, the line width of the line patterns is increased. The so-called alternating PSM is used to define line patterns with a high resolution.

A conventional alternating PSM photolithographic process is illustratively depicted in the following with reference to FIG. 1, which is a cross-sectional view of a conventional alternating PSM. A method of fabricating the conventional alternating PSM comprises the step of forming a patterned chromium film 102 as a mask on a light-penetrable substrate 100 such as a glass substrate or a quartz substrate, and the step of etching the substrate 100 to form a trench 103. There are two areas that can cause a phase shift of 180° when incident light passes through them. These are the thickness 11 of a region 10 of the substrate 100 which is exposed by the chromium film 102 and the thickness 12 of a region 20 where the trench 13 is formed. However, the difference between the region 10 of the substrate 100 which is exposed by the chromium film 102 and the region 20 where the trench 13 is formed directly affects the phase shift caused to the incident light. Also, it is difficult to control the etching process that creates thickness 13. As a result, the incident light passing through the region 10 of the substrate 100, which is exposed by the chromium film 102, and the region 20 where the trench 13 is formed cannot undergo the phase shift of 180°. This means that the alternating PSM can not achieve the required interference.

Another conventional alternating PSM photolithographic process is illustratively depicted in the following with reference to FIGS. 2A–2C. Referring first to FIG. 2A, a chromium film 202 is formed on a light-penetrable substrate 200 such as a glass substrate, a quartz substrate, or other suitable material. Next, referring to FIG. 2B, the chromium film 202 is defined and a chromium film 202a is left to cover a sheltered region S. A phase shift layer 204 is formed on the light-penetrable substrate 200. The material of the phase shift layer 204 is, for example, $SiO_xN_y$ or $Mo_zSiO_xN_y$. Then, referring to FIG. 2C, the phase shift layer 204 is defined by using the light-penetrable substrate 200 as an etching stop layer and a phase shift layer 204a is left to cover a shifting region P.

A shift angle from the phase shift layer 204 is the key to determining either destructive interference or constructive interference to light passing through a penetrating region T and the shifting region P during exposure. One factor that influences the shift angle is the characteristics of the phase shift layer 204. Another important factor is the thickness 205 of the phase shift layer 204. A conventional method of fabricating the mask described above is to define a pattern of the chromium film 202 and deposit and pattern the phase shift layer 204a on the semi-finished substrate 200, which has the chromium film 202 and a photoresist layer already formed thereon. It is difficult to gain a uniform thickness from coating a material on a square substrate. Furthermore, coating the phase shift layer 204 on the substrate 200 with a pattern of chromium film 202 already formed on it results in poor step-coverage. The reasons described above make the thickness 205 of the phase shift layer 204a non-uniform and make a difference in the phase angles of the incident light passing through regions of the mask. This results in the poor resolution of the PSM illustrated above.

SUMMARY OF THE INVENTION

It is therefore the object of the invention to provide an alternating phase shift mask for use in photolithography in semiconductor fabrication which can avoid the poor coverage of the phase shift layer and non-uniform thicknesses, and enhance the resolution of the PSM.

The invention achieves the above-identified objects by providing an alternating phase shift mask, which comprises a phase shift layer places between a light-penetrable substrate and a sheltering layer. The sheltering layer covers a sheltered region formed on the phase shift layer. The phase shift layer also has an opening between the sheltered region to expose the light-penetrable substrate, where the exposed portion of the substrate defines a penetrating region while the portion of the phase shift layer between the sheltered region without being removed define the phase shifting region. The incident light travels through the penetrating region without changing its phase but travels through the phase shifting region with a wave phase angle shifted by 180°. When the lights from the penetrating region interferes with the light from the phase shifting region, the resolution of photolithographic process is enhanced.

The invention achieves the above-identified objects by providing a method of fabricating an alternating phase shift mask which comprises a step of forming a phase shift layer on a light-penetrable substrate; a step of forming a sheltering layer on the phase shift layer; and a step of defining the sheltering layer and the phase shift layer to form a PSM with a penetrating region, a phase shift region and a sheltered region. Because the phase shift layer can be deposited with an accurate thickness according to the characteristic of the material and to the shift angle, the invention is free from the faults and the limits of the conventional process.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
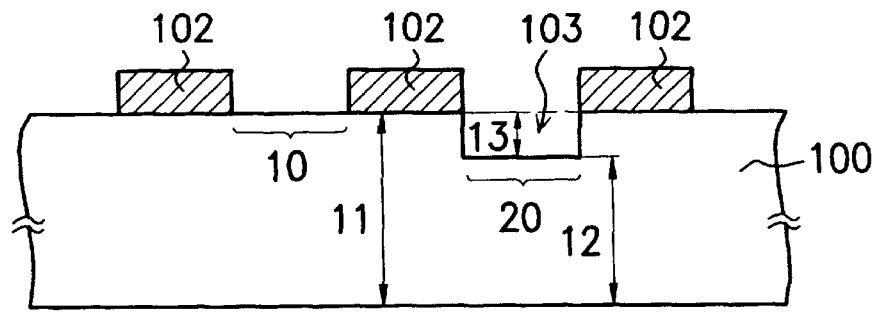
FIG. 1 is a cross-sectional view of the conventional alternating PSM.
Figure 2A:
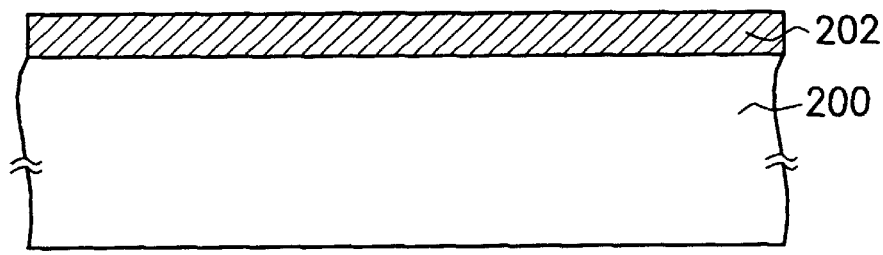
FIGS. 2A–2C are cross-sectional views showing the process steps of one conventional method for fabricating an alternating PSM.
Figure 2B:
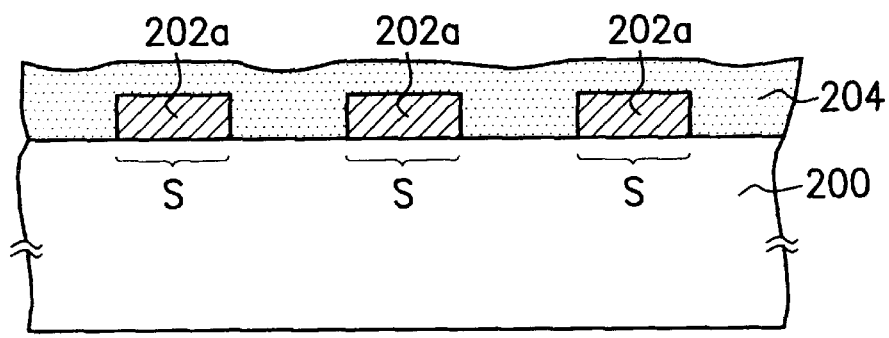
Figure 2C:
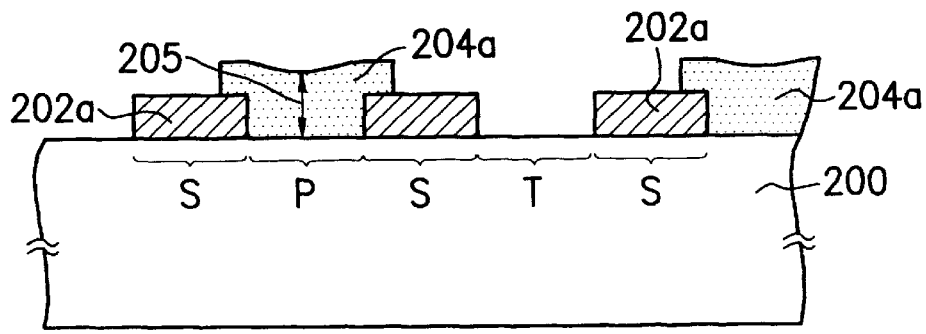
Figure 3A:
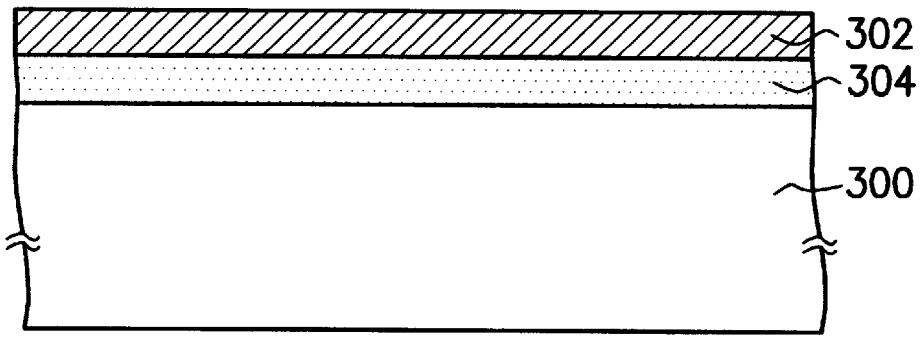
FIGS. 3A–3C are cross-sectional views showing the process steps of one preferred embodiment of the method for fabricating an alternating PSM.

Referring first to FIG. 3A, a phase shift layer 304, which can make incident light form a shift angle of 180°, is formed on a light-penetrable substrate 300 such as a glass substrate or a quartz substrate. Next, a sheltering layer 302 is formed on the phase shift layer 304. The material of the phase shift layer 304 is, for example, silicon-oxy-nitride ($SiO_xN_y$) or molybdic-silicon-oxy-nitride ($MoSi_zO_xN_y$). The material of the sheltering layer 302 comprises chromium.

Figure 3B:
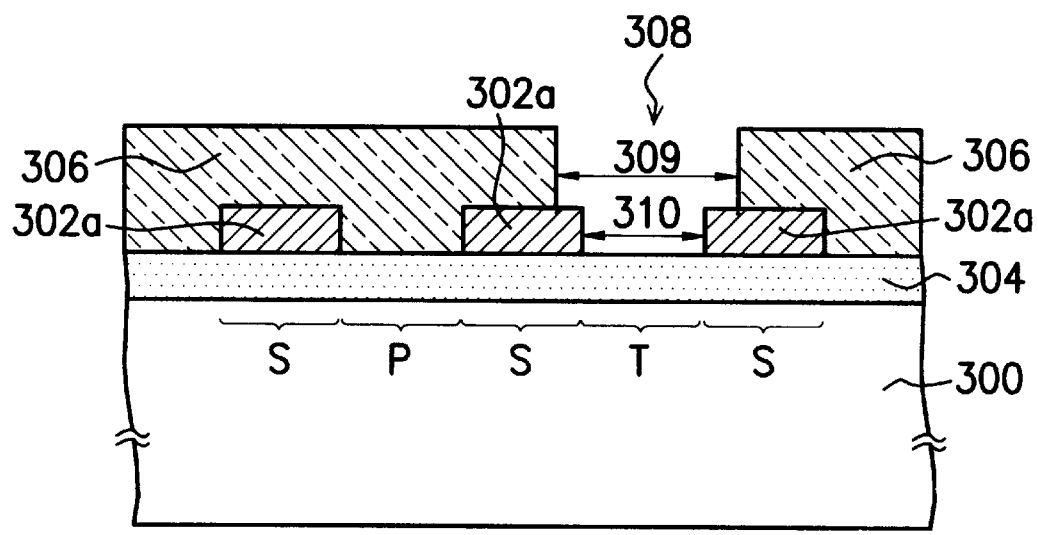

Referring to FIG. 3B, the sheltering layer 302 is defined by using the phase shift layer 304 as an etching stop layer. The remaining sheltering layer 302a lies over the sheltered region S. Then, the pattern of a phase shift layer 304 is defined. In a conventional method for defining the pattern, first a defined photoresist layer 306 with an opening pattern 308 is formed on the light-penetrable substrate 300. The width 309 of the opening pattern 308 is provided by the erroneous deviation from the overlay during exposure. The width 309 of the opening pattern 308 is about the same as the distance 310 at the penetrating region T.

Figure 3C:
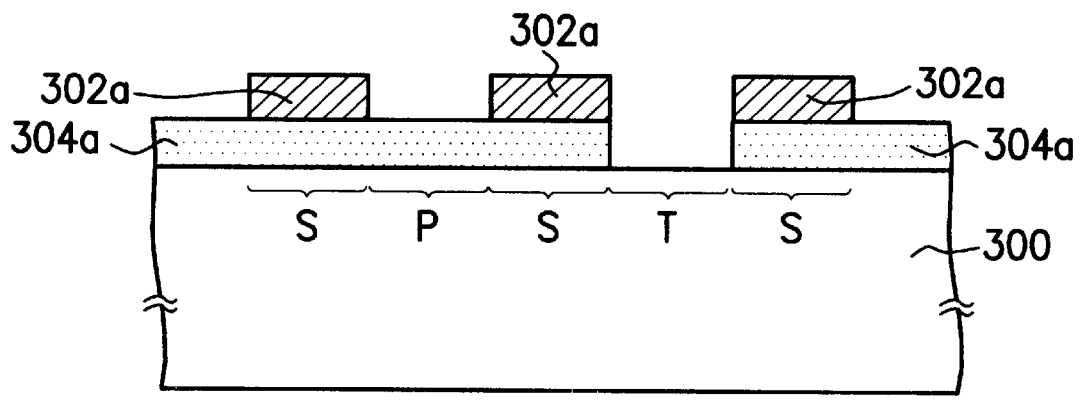

Referring to FIG. 3C, the phase shift layer 304 is etched by using the photoresist layer 306 and the sheltering layer 302a as etching masks and using the light-penetrable substrate 300 as an etching stop layer. The remaining phase shift layer 304a lies over the phase shift region P and over the sheltered region S on the light-penetrable substrate 300, but the penetrating region T of the light-penetrable substrate 300 is exposed.

According to the invention, the PSM at least comprises a light-penetrable substrate 300 through which an incident light can penetrate, a phase shift layer that makes the incident light shift 180° in angle, and a sheltering layer 302a used to cover the light-penetrable substrate 300. The phase shift layer 304a lies between the light-penetrable substrate 300 and the sheltering layer 302a and covers the sheltered region S and the phase shift region P on the light-penetrable substrate 300. The sheltering layer 302a lies on the phase shift layer 304a and covers the sheltered region S. The area exposed by the phase shift layer 304a and the sheltering layer 302a is defined as a penetrating region T.

Further, a semi-finished PSM can be produced from the PSM structure provided by the invention. The semi-finished PSM is different from a universal product used now. The structure of the semi-finished PSM comprises a light-penetrable substrate on which a phase shift layer and a sheltering layer are formed, onto which a photoresist layer is selectively coated. Since the semi-finished PSM can be executed by defining a mask and etching directly, the uniformity of the phase shift layer, the sheltering layer and the photoresist layer can be controlled. The result increases the yield.

One feature of the alternating PSM of the invention is that the phase shift layer is directly provided on the substrate and below the sheltering layer. A material whose characteristics meet the requirements of the desired phase shift layer and shift angle is accurately deposited to the necessary thickness. The defects of poor coverage and the non-uniformity of thickness as seen in the conventional process are improved upon.

Another feature of the alternating PSM of the invention is that the semi-finished PSM can be directly provided by the manufacturer. Then, the semi-finished PSM is defined by the mask pattern to form the required PSM, which enhances the resolution of the photolithographic process.

While the invention has been described by way of example and in terms of a preferred embodiment, it is to be understood that the invention is not limited thereto. To the contrary, it is intended to cover various modifications and similar arrangements and procedures. The scope of the appended claims therefore should be accorded the broadest interpretation so as to encompass all such modifications and similar arrangements and procedures.

What is claimed is:

1. A method of fabricating an alternating phase shift mask, consisting of:

providing a light-penetrable substrate;

forming a phase shift layer and a sheltering layer abutting against the light-penetrable substrate;

defining the sheltering layer to expose a desired phase-shift portion and a desired light-transmitting portion of the phase shift layer, wherein a portion under the defined sheltering layer is a sheltered portion;

forming a photoresist layer with an opening on the sheltering layer and the phase shift layer, wherein the opening exposes the light-transmitting portion of the phase shift layer and a portion of the sheltering layer abutting the light-transmitting portion, the opening of the photoresist layer has an erroneous deviation from an edge of the light-transmitting portion;

etching the phase shift layer at the light-transmitting portion to expose the light-penetrable substrate, using the photoresist layer and the sheltering layer as a mask, wherein the sheltering layer determines the edge of the light-transmitting portion; and removing the photoresist layer.

2. A method according to claim 1, wherein the light-penetrable substrate comprises quartz.

3. The method according to claim 1, wherein the phase shift layer comprises silicon-oxy-nitride.

4. The method according to claim 1, wherein the phase shift layer comprises molybdic-silicon-oxy-nitride.

5. The method according to claim 1, wherein the sheltering layer comprises chromium.

* * * * *